United States Patent
Li et al.

(10) Patent No.: US 6,825,519 B2
(45) Date of Patent: Nov. 30, 2004

(54) SELECTIVELY DEPOSITED PGO THIN FILM AND METHOD FOR FORMING SAME

(75) Inventors: Tingkai Li, Vancouver, WA (US); Sheng Teng Hsu, Camas, WA (US); Bruce D. Ulrich, Beaverton, OR (US)

(73) Assignee: Sharp Laboratories of America, Inc., Camas, WA (US)

( * ) Notice: Subject to any disclaimer, the term of this patent is extended or adjusted under 35 U.S.C. 154(b) by 0 days.

(21) Appl. No.: 10/401,212

(22) Filed: Mar. 27, 2003

(65) Prior Publication Data

US 2004/0188743 A1 Sep. 30, 2004

(51) Int. Cl.$^7$ ................................ H01L 29/72
(52) U.S. Cl. ............... 257/306; 257/295; 257/296
(58) Field of Search ............... 257/295, 296, 257/306

(56) References Cited

U.S. PATENT DOCUMENTS

| 6,190,925 B1 | 2/2001 | Li et al. | 438/3 |
| 2003/0234412 A1 * | 12/2003 | Yamanobe | 257/295 |

OTHER PUBLICATIONS

Tingkai Li, Sheng Teng Hsu, Bruce Ulrich, Hong Ying, Lisa Stecker, Dave Evans, Yoshi Ono, Jer–shen Maa and J.J.Lee "Fabrication and Characterization of Pb$_5$Ge$_3$O$_{11}$ One–transistor–memory Device" Appl. Phys. Lett. 79 (11) 1661 (Jan. 2001).

Tingkai Li, Fengyan Zhang and Sheng Teng Hsu, "The Ferroelectric Properties of c–axis Oriented Pb$_5$Ge$_3$O$_{11}$ Thin Films Prepared by Metalorganic Chemical Vapor Deposition" Appl. Phys. L tt. 74 (2) 296 (Jan. 1999).

* cited by examiner

Primary Examiner—Edward Wojciechowicz
(74) Attorney, Agent, or Firm—David C. Ripma; Matthew D. Rabdau; Joseph P. Curtin

(57) ABSTRACT

A memory device formed from selectively deposited PGO and a method for selectively forming a Pb$_5$Ge$_3$O$_{11}$ (PGO) thin film memory device are provided. The method comprises: forming a silicon (Si) substrate; forming a silicon oxide film overlying the substrate; forming a patterned bottom electrode overlying the silicon oxide film; selectively depositing a PGO film overlying the bottom electrode; annealing; and, forming a top electrode overlying the PGO film. Selectively depositing a PGO film overlying the bottom electrodes includes: depositing a seed layer of PGO; and, forming a c-axis oriented PGO layer overlying the seed layer.

22 Claims, 6 Drawing Sheets

THRESHOLD ADJUSTMENT ION IMPLANTATION
GROW GATE OXIDE + CVD POLYSILICON

STI MASK

ETCHES TRENCHES + RE-OXIDATION + CVD OXIDE
+ CMP OXIDE STOPPED AT POLISILICON

FE PATTERNED AND ETCHED POLISILICON + N
+ ION IMPLANTATION CVD OXIDE AND CMP OXIDE +
Ti BARRIER + BOTTOM ELECTRODE +CVD NITRIDE

FE MASK, ETCHES NITRIDE
STOPPED AT BOTTOM ELECTRODE

ETCHES BOTTOM ELECTRODE
STOPPED AT Ti BARRIER

ETCHED Ti BARRIER

CVD OXIDE + CMP OXIDE STOPPED AT NITRIDE
+ WET ETCHED NITRIDE

CVD TiO2 + PLASMA ETCHES TiO2

CMP FE

DEPOSIT TOP ELECTRODE
GP MASK; ETCHES TOP ELECTRODE

US 6,825,519 B2

SELECTIVELY DEPOSITED PGO THIN FILM AND METHOD FOR FORMING SAME

BACKGROUND OF THE INVENTION

1. Field of the Invention

This invention generally relates to integrated circuit (IC) ferroelectric thin film processes and, more particularly, to selectively deposited PGO thin films suitable for use with ferroelectric non-volatile memory devices.

2. Description of the Related Art

Ferroelectric-gate controlled devices, such as metal-ferroelectric-silicon field-effect transistor (MFS FET), were studied as early as the 1950s. In recent years, ferroelectric-gate controlled memory transistors have attracted much attention for high-density nonvolatile memory applications. Two kinds of device structures, Metal-Ferroelectric-Insulator-Silicon (MFIS) FET and Metal-Ferroelectric-Metal-Oxide-Silicon (MFMOS) FET, have been fabricated thus far. The ferroelectric $Pb_3Ge_5O_{11}$ (PGO) thin films have a smaller polarization, a relatively large coercive field, and a lower dielectric constant. Therefore, PGO is a prime candidate for one-transistor memory applications. Extremely high c-axis oriented PGO thin films can be deposited on Pt and Ir metals, and working 1T-memory devices with PGO MFMOS memory cells have been fabricated. Even so, high quality 1T devices with good retention properties have been found to be difficult to fabricate. The problems result from the poor quality of; the ferroelectric thin films, the leakage current of 1T devices, and the trapped charges in ferroelectric and oxide capacitors. These integration-induced damages are largely the result of PGO etching processes.

It would be advantageous if ferroelectric capacitors, suitable for use in 1T memory applications, could be fabricated with Ir or Pt electrodes.

It would be advantageous if the PGO memory material overlying a metal electrode could be formed without an etching process.

SUMMARY OF THE INVENTION

The present invention introduces a selective deposition technology for the formation of c-axis PESO thin films on Ir and Pt metals, to improve the integration process of PGO MFMOS transistor ferroelectric memory devices.

Accordingly, a method is provided for selectively forming a $Pb_5Ge_3O_{11}$ (PGO) thin film memory device. The method comprises: forming a silicon (Si) substrate; forming a silicon oxide film overlying the substrate; forming a patterned bottom (Electrode overlying the silicon oxide film; selectively depositing a PGO film overlying the bottom electrode; annealing; and, forming a top electrode overlying the PGO film.

Selectively depositing a PGO film overlying the bottom electrode includes: depositing a seed layer of PGO; and, forming a c-axis oriented PGO layer overlying the seed layer.

Additional details of the above-described method, including the preparation of the PGO precursor, the PGO seed layer and c-axis PGO layer deposition processes, as well as devices from the selective deposition of PGO films are provided below.

DETAILED DESCRIPTION OF THE PREFERRED EMBODIMENTS

Figure 1:
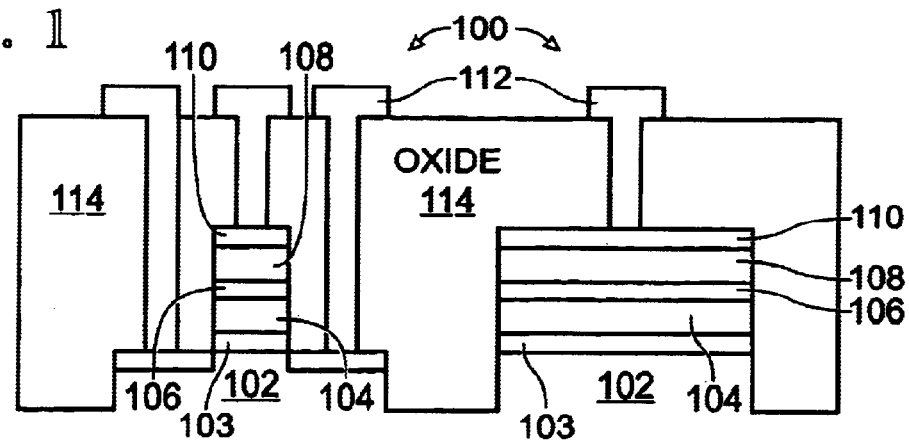
FIG. 1 is a partial cross-sectional view of the present invention 1T memory device capacitor formed from the selective deposition of a $Pb_5Ge_3O_{11}$ (PGO) film.

FIG. 1 is a partial cross-sectional view of the present invention 1T memory device capacitor formed from the selective deposition of a $Pb_5Ge_3O_{11}$ (PGO) film. The capacitor 100 comprises a first., silicon (Si) layer 102, the Si layer 102 can be doped. An oxide layer 103 overlies the Si layer 102. A second, polysilicon layer 104 overlies the oxide layer 103. The polysilicon layer 104 can be doped, such as N+silicon. For example, Si layer 104 can be a gate. A patterned bottom electrode 106 overlies the Si layer 104. A c-axis oriented PGO film 108 overlies the bottom electrode 106. A top electrode 110 overlies the PGO film 108. As shown, the capacitor 100 can be formed as an independent structure (right side of drawing) with an interlevel metal interconnect, or overlying a transistor (the doped Si area being a gate), also with interlevel metal interconnects 112, as shown on the left side of the figure. In some aspects, the capacitor 100 is surrounded by a passivation oxide layer 114, such as TEOS. In other aspects not shown, a barrier, such as TiO2, is interposed between the PGO film 108+ and the oxide 114 (See FIG. 6i for details).

The capacitor 100 exhibits, a number of remarkable characteristics that are directly attributable to the selective deposition of the PGO 108. These characteristics are explained in detail below. Generally, the capacitor 100 exhibits a 2Pr polarization) of 3 to 5 $\mu C/cm^2$, a 2Ec (coercive field) of in the range of 100 to 200 kilovolts per centimeter (kV/cm), a leakage current of 7.95×10.8 amps per centimeter (A/cm) at 100 kilovolts per centimeter (kV/cm), and a charge retention of 0.93 (in 24 minutes).

Functional Description

Figure 6A:
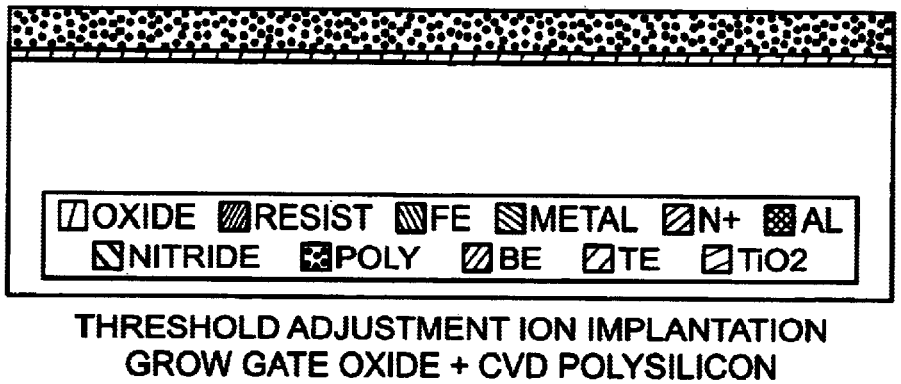
FIGS. 6a through 6k illustrate a series of steps that are performed in the fabrication of the 1T memory device capacitor of FIG. 1.

FIG. 6a through 6k illustrate a series of steps that are performed in the fabrication of the 1T memory device capacitor of FIG. 1. In FIG. 6a a threshold ion implantation is performed and gate oxide is grown over a Si substrate and doped C VD polysilicon is grown over the gate oxide.

Figure 6B:
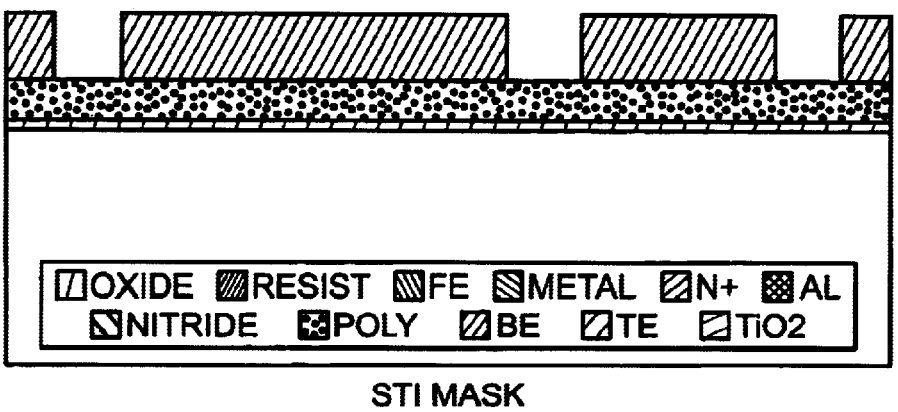

In FIG. 6b a photoresist mask is formed over the polysilicon.

Figure 6C:
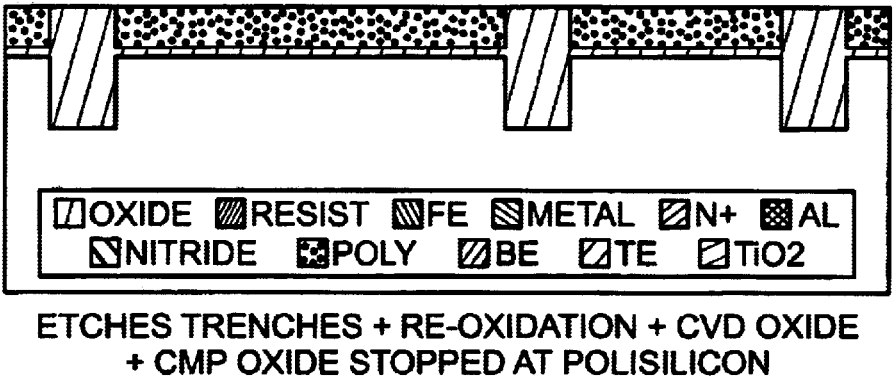

In FIG. 6c trenches are forked as a result of the mask. The trenches are filled with oxide, and the oxide CMP is stopped at the polysilicon.

Figure 6D:
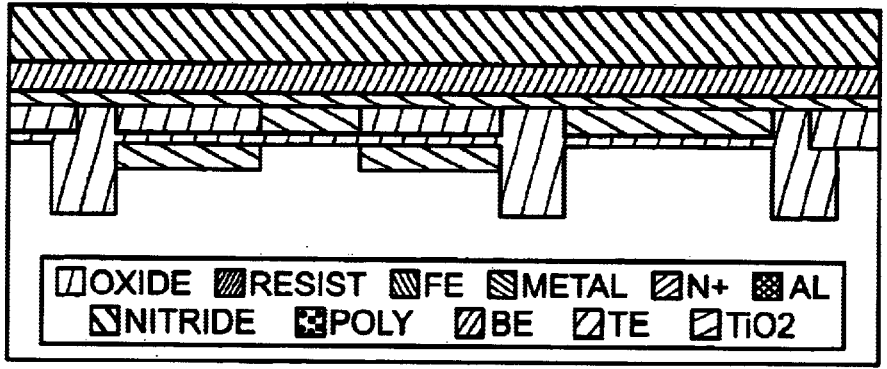

In FIG. 6d, N+regions are formed into active areas, such as a source or drain. A barrier layer of Ti or TaN is deposited, with overlying layers of a bottom electrode (BE) and nitride.

Figure 6E:
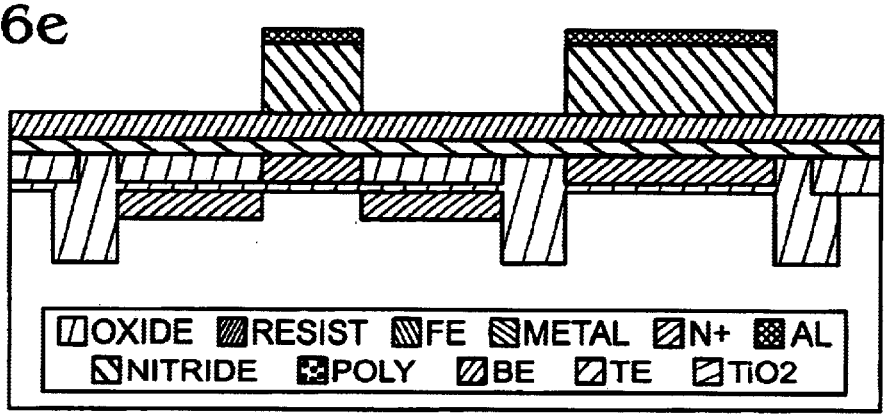

In FIG. 6e a ferroelectric (FE) mask is formed and the nitride is etched to the BE.

Figure 6F:
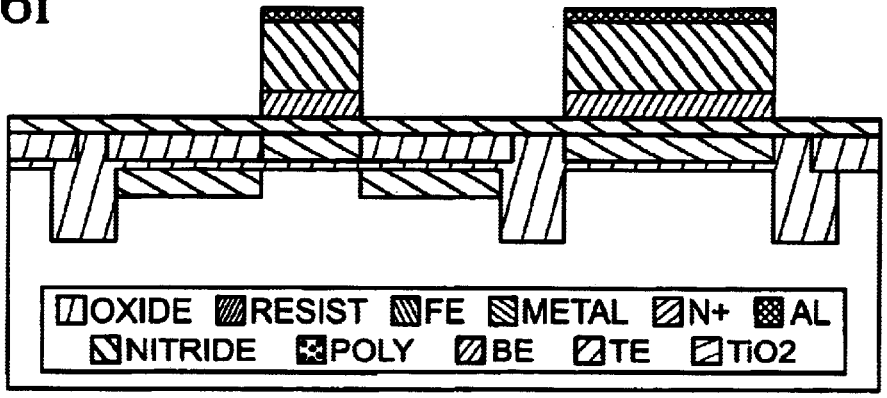

In FIG. 6f the exposed BE is etched to the barrier.

Figure 6G:
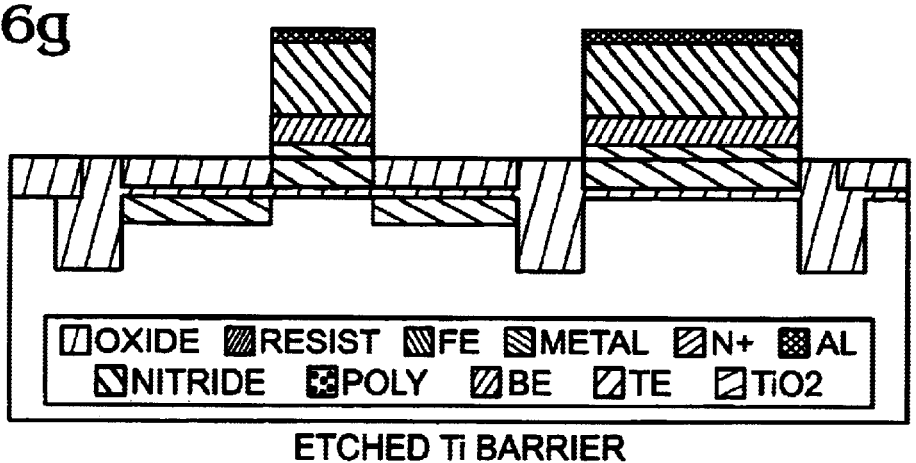

In FIG. 6g the exposed barrier is etched.

Figure 6H:
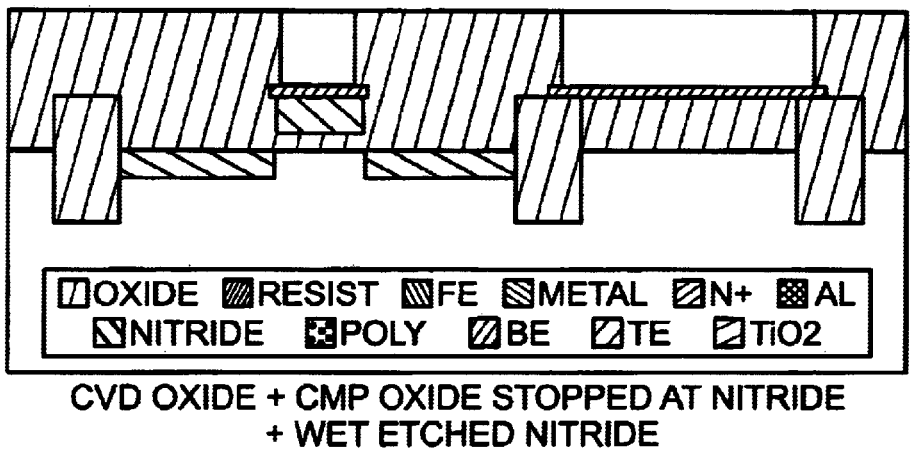

In FIG. 6h CVD oxide is deposited and CMP planarized to the nitride. Then, the nitride is wet etched.

Figure 6I:
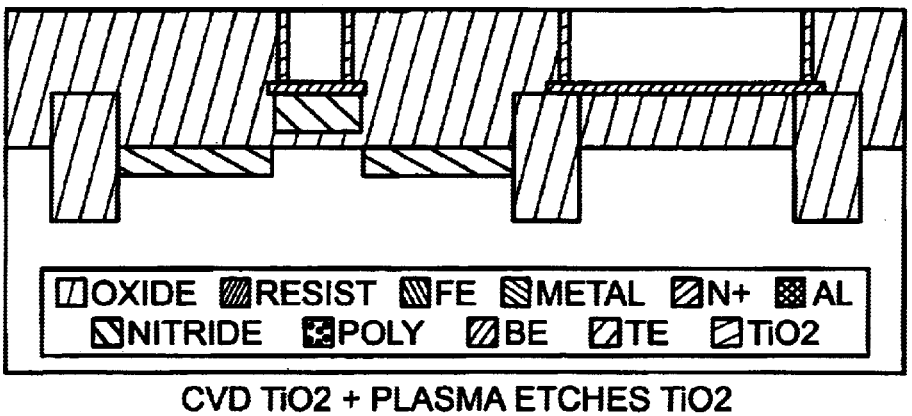

In FIG. 6i a sidewall barrier of a material such as TiO2 is deposited and plasma etched.

Figure 6J:
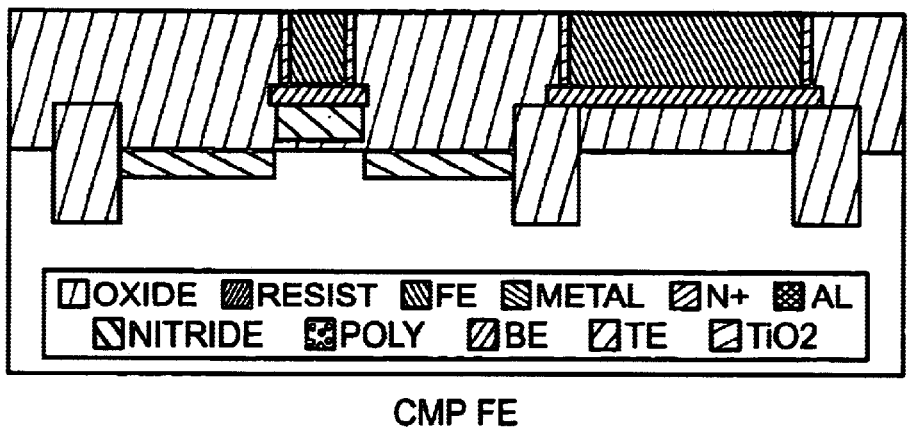
Figure 6K:
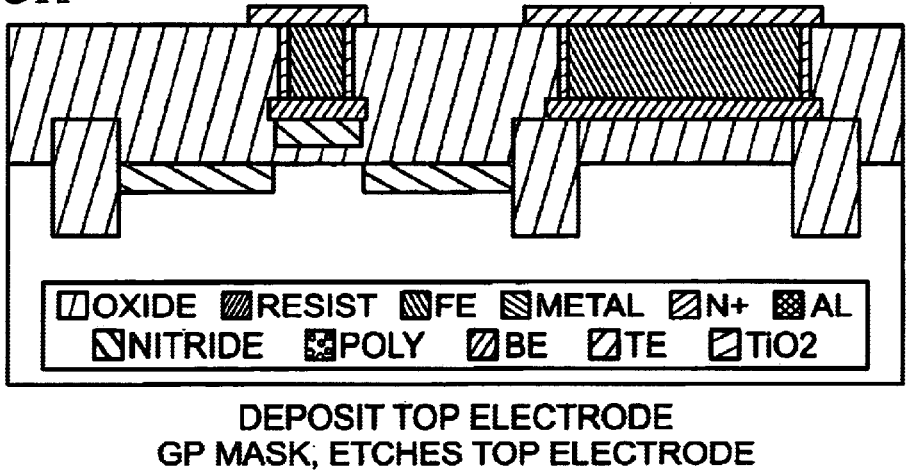

In FIG. 6j an FE; material such a PGO is selectively deposited and CMP planarized to the oxide.

In FIG. 6k top electrodes are formed.

Some details of the above-mentioned fabrication follow.

1. The Si wafers are cleaned using SC1+SC2, where SC1 is deionized $H_2O$: 5500 ml, $NH_4OH$: 1100 ml, and $H_2O_2$: 1100 ml, and SC2 is DI $H_2O$: 6000 ml, HCl: 1000 ml, and $H_2O_2$: 1000 ml.
2. Surface oxide is removed by hydrofluoric acid (HE) dip etch.
3. 3.5–15 nanometer (nm) thick $SiO_2$ films are deposited on the Si substrates.
4. A 200 nm doped polysilicon film is deposited on the oxide.
5. The bottom electrodes are formed from 20 nm of Ti, and 150 nm of Ir or Pt, deposited on the polysilicon.
6. The bottom electrodes are patterned and etched.
7. After TEOS deposition, a chemical mechanical polishing (CMP) process planarizes the oxide to stop on the bottom electrode.
8. An HF dip is used to clean the surface of the bottom electrode.
9. An oxide MOCVD reactor is used for the selective deposition of c-axis oriented $Pb_5Ge_3O_{11}$ thin films on the bottom electrodes.

The following is the detailed description of the selective MOCVD processes. [Pb(thd)$_2$] and [Ge(ETO)$_4$], with a molar ratio of 5–5.5:3, are dissolved in a mixed solvent of butyl ether or tetrahydrofuran, isopropanol and tetraglyme in the molar ratio of 8:2:1. The precursor solution has a concentration of 0.1 M/L, of PGO. The solution is injected into a vaporizer at temperature in the range of 180–240° C., at a pump at a rate of 0.05–0.2 ml/min, to form a precursor gas. The feed line is kept at 185–245° C. A two-step PGO deposition processes is then used.

1) Selective seed layer deposition on bottom electrode:

Deposition temperature and pressure: 500–540° C. and 1–5 Torr, respectively;

Oxygen partial pressures: 20–30%;

Vaporizer temperature: 180–200° C.;

Solution delivery rates: 0.05–0.1 ml/min; and,

Deposition time: 5–20 minutes.

2) Selective deposition conditions for c-axis PGO deposited on bottom electrodes:

Deposition temperatures and pressure: 380–420° C. and 5–10 Torr, respectively

Oxygen partial pressures: 30–40%;

Vaporizer temperature: 200–240° C.;

Solution delivery rates: 0.1–0.2 ml/min; and,

Deposition time: 1–3 hour, depending on film thickness.

The post-deposition annealing temperature and time are 520–660° C. and 0.5–1 hour, respectively. The annealing is carried out in oxygen atmosphere.

The one-transistor memory devices built using the above-mentioned process yield memory windows of around 2–3V. The memory windows are almost saturated from operation voltage of 3V. For the one transistor memory device, after writing the "off" state (−5 V), the drain current ($I_D$) at a $V_D$ of 0.1V and a $V_G$ of 0, 0.5, and 1 V is about $2 \times 10^{-14}$ A. After writing the "on" state (+5 V), the drain current ($I_D$) at a $V_D$ of 0.1V and a $V_G$ of 0, 0.5, and 1 V is about $1 \times 10^{-5}$ A. The ratio of the "on" state current to the "off" state current is close to 9 orders of magnitude. The 1T devices show very good memory characteristics. The one-transistor memory devices also show very good retention properties.

An EMCORE oxide metalorganic chemical vapor deposition (MOCVD) reactor was used for the growth of PGO films. The PGO films were deposited on a 6" Ir/Ti/SiO$_2$/Si substrate and then a top electrode of Pt was deposited on PGO thin film to form MFMOS capacitors for ferroelectric hysteresis loop and C-V testing. For fabrication of N-channel 1T memory devices, P-type Si (100) wafers were used for substrates. The integration processes are as follows: shallow trench insulation (STI), gate oxide of SiO$_2$ deposition, bottom electrode of polysilicon, source and drain implantation, Ir floating gate deposition, nitride gate replacement, MOCVD PGO selective deposition, chemical mechanical planarization (CMP), top electrode of Pt deposition, etching top electrode and contact hole, metallization and etc. The PGO MFMPOS one-transistor memory devices with thicknesses of Pt: 150 nm/PGO: 300 nm/Ir: 150 nm/Polysilicon: 300 nm/SiO$_2$: 3.5–6.0 nm/Si were fabricated, as shown in FIG. 1.

The ferroelectric properties were measured with a standardized RT66A tester. The capacitances of the PGO MFM-POS capacitors were measured using an HP 4284A Precision LCR meter at room temperature with a frequency of 10 kHz. The properties of the 1T memory devices were measured using HP4155-6 precision semiconductor parameter analyzer at room temperature. The hysteresis loops of the PGO thin films with and without etching processes were also measured.

Figure 2:
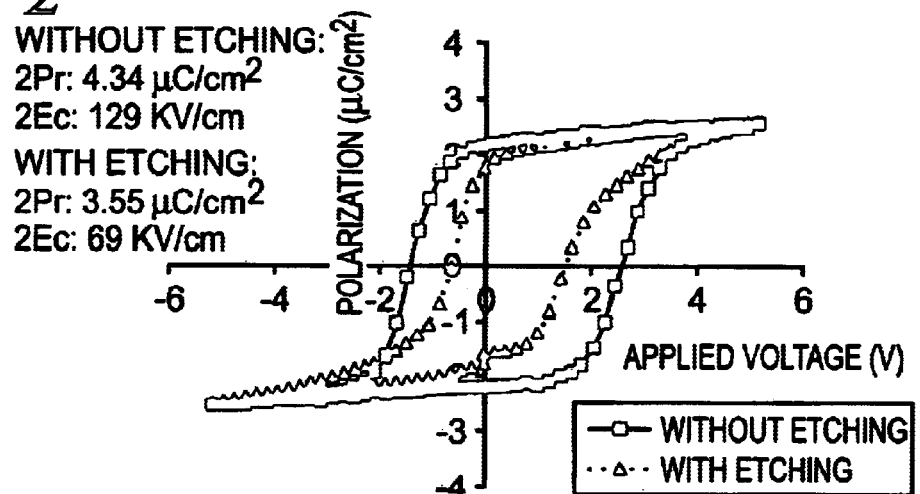
FIG. 2 is a graph illustrating the hysteresis loops of devices formed from both etched and selectively deposited PGO films.

FIG. 2 is a graph illustrating the hysteresis loops of devices formed from both etched and selectively deposited PGO films. The hysteresis loop associated with the selectively deposited PGO film is square, symmetric and saturated from 3 V, which indicates very good ferroelectric properties. When the capacitor is operated at 5V, the PGO exhibits 2Pr of 4.34 μC/cm$^2$ and 2Ec of 129 kV/cm.

Figure 3:
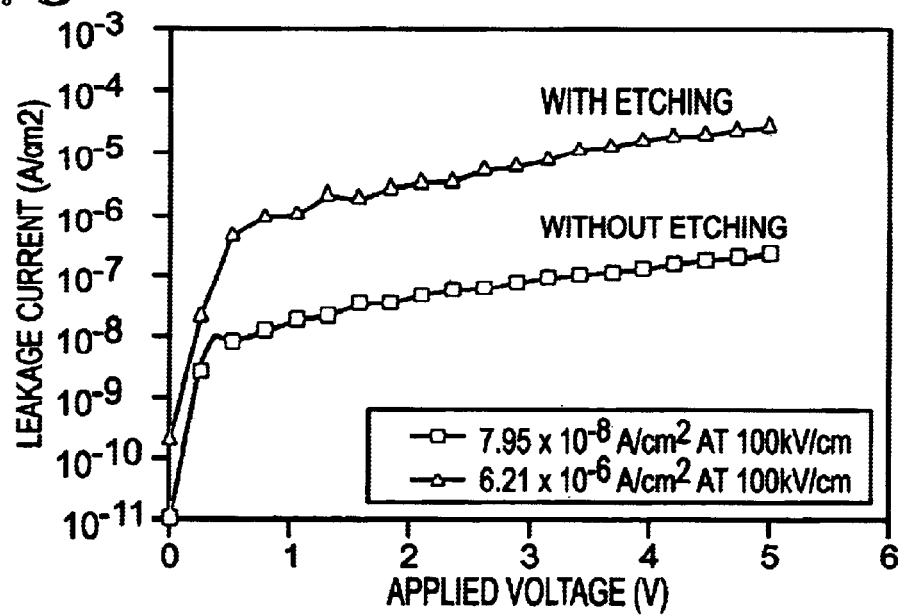
FIG. 3 is a graph illustrating the leakage current properties of devices formed from both etched and selectively deposited PGO films.

FIG. 3 is a graph illustrating the leakage current properties of devices formed from both etched and selectively deposited PGO films. The PGO capacitors formed from selectively deposited PGO show a low leakage currents of $7.95 \times 10^{-8}$ A/cm$^2$ at 100 kV/cm.

Figure 4:
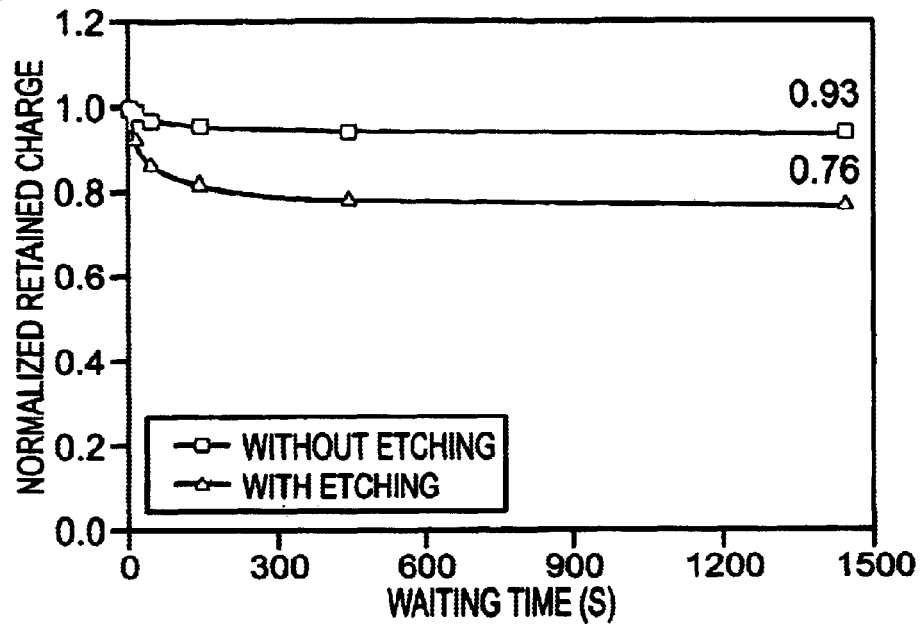
FIG. 4 is a graph illustrating the retention properties of devices formed from both etched and selectively deposited PGO films.

FIG. 4 is a graph illustrating the retention properties of devices formed from both etched and selectively deposited PGO films.

Compared to the present invention PGO thin films, the Pr and 2Ec of the PGO thin films made from etching processes dropped from 4.34 μC/cm$^2$ and 2Ec of 129 kV/cm to 3.55 μC/cm$^2$ and 69 kV/cm respectively, as shown in FIG. 2. The leakage currents, which are shown in FIG. 3, increased from $7.95 \times 10^{-8}$ A/cm$^2$ at 100 kV/cm to $6.21 \times 10^{-6}$ A/cm$^2$ at 100 kV/cm. Due to the formation of defects during the etching processes and higher leakage current, the retention properties of PGO thin film capacitors also degraded. The normalized charge retention decreased from 0.93 to 0.76 in 24 minutes, as shown in FIG. 4. These poor ferroelectric properties cannot be completely resolved using annealing processes.

Figure 5:
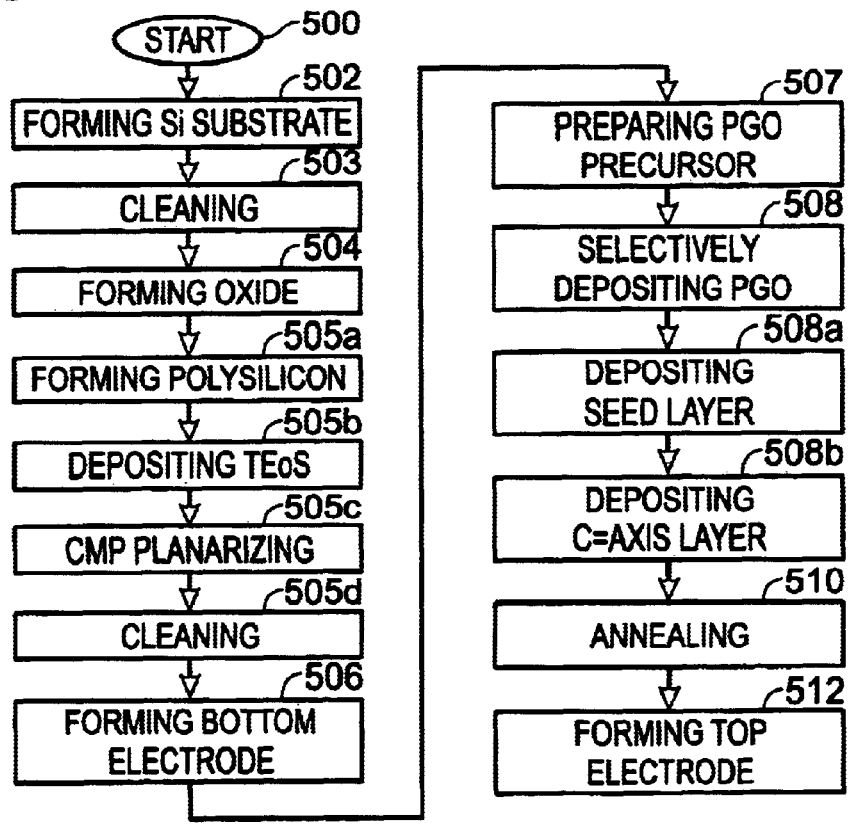
FIG. 5 is a flowchart illustrating the present invention method for selectively forming a $Pb_5Ge_3O_{11}$ (PGO) thin film memory device.

FIG. 5 is a flowchart illustrating the present invention method for selectively forming a $Pb_5Ge_3O_{11}$ (PGO) thin film memory device. Although the method is depicted as a sequence of numbered steps for clarity, no order should be inferred from the numbering unless explicitly stated. It should be understood that some of these steps may be skipped, performed in parallel, or performed without the requirement of maintaining a strict order of sequence. The method starts at Step 500.

Step 502 forms a silicon (Si) substrate. As described above, this Si layer can be doped Si and be formed into active areas, such as a channel, drain, or source regions. Step 504 forms a silicon oxide film overlying the substrate. As described above, this oxide layer may be a gate oxide layer. In some aspects, the silicon oxide layer has a thickness in the range of 3.5 to 15 nm. Step 506 forms a patterned bottom electrode overlying the silicon oxide film. In other aspects, an additional Step 505a forms a layer of polysilicon, such as a transistor gate, interposed between the silicon oxide layer and the bottom electrode. Step 507 prepares a PGO precursor. Step 508 selectively deposits a PGO film overlying the bottom electrode. Step 510, following the deposition of the PGO film, anneals the PGO film. In some aspects, annealing is, performed at a temperature in the range of 520 to 560 degrees C., for a duration in the range of 0.5 to 1 hour. In other aspects, the annealing is performed in an oxygen atmosphere. Step 512 forms a top electrode overlying the PGO film.

In some aspects of the method, selectively depositing a PGO film overlying the bottom electrode in Step 508 includes substeps. Step 508a deposits a seed layer of PGO. Step 508b forms a c-axis oriented PGO layer overlying the seed layer.

Preparing a PGO precursor is Step 507 includes substeps (not shown). Step 507a dissolves a mixture of [Pb(thd)$_2$] and {Ge(ETO)$_4$} in a solvent. Step 507b injects the solution into a vaporizer:

at a temperature in the range of 180 to 240 degrees C.; and, at a pump rate in the range of 0.05 to 0.2 milliliters/minute (ml/min).

Step 507c maintains the vaporizer feed line at a temperature in the range of 185 to 245 degrees C.

In some aspects, dissolving a mixture of [Pb(thd)$_2$] and {Ge(ETO)$_4$} in a solvent in Step 507a includes mixing the [Pb(thd)$_2$] and {Ge(ETO)$_4$} in a molar ratio in the range of 5:3 to 5.5;3. In other aspects; dissolving a mixture of [Pb(thd)$_2$] and {Ge(ETO)$_4$} in a solvent includes using a solvent of isopropanol, tetraglyme, and an additional element such as butyl ether or tetrahydrofuran. In some aspects, using a mixed solvent includes using the mixed solvent in a molar ratio of 2:1:8.

In some aspects, depositing a seed layer of PGO in Step 508a, includes substeps (not shown). Step 508a1 heats the substrate to a temperature in the range of 500 to 540 degrees C. Step 508a2 creates a pressure in the range of 1 to 5 Torr. Step 508a3 creates an oxygen partial pressure of 20 to 30%. Step 508a4 creates a vaporizer temperature in the range of 180 to 200 degrees C. Step 508a5 delivers the vaporized precursor solution at a rate of 0.05 to 0.1 ml/min, for a duration in the range of 5 to 20 minutes.

In other aspects, depositing a c-axis PGO layer in Step 508b includes substeps (not shown). Step 508b1 heats the substrate to a temperature in the range of 380 to 420 degrees C. Step 508b2 creates a pressure in the range of 5 to 10 Torr. Step 508b3 creates an oxygen partial pressure of 30 to 40%. Step 508b4 creates a vaporizer temperature in the range of 200 to 240 degrees C. Step 508b5 delivers the vaporized precursor solution at a rate of 0.1 to 0.2 ml/min, for a duration in the range of 1 to 3 hours.

In some aspects, forming a patterned bottom electrode overlying the silicon oxide film in Step 506 includes substeps (not shown), Step 506a forms a bottom electrode first layer of a first metal overlying the silicon oxide. Step 506b forms a bottom electrode second layer of a second metal overlying the first layer. The bottom electrode first layer first metal can be Ti, TiN, Ta, or TaN. The bottom electrode second layer second metal can be Ir, Pt, Au, or Rh.

For example, forming a bottom electrode first layer of Ti in Step 506a may include forming a layer of Ti having a thickness in the range of 10 and 30 nanometers (nm). Forming a bottom electrode second layer in Step 506b may includes the second metal having a thickness in the range of 100 to 200 nm.

In other aspects, forming a bottom electrode overlying the silicon oxide film includes additional substeps (not shown). Step 506c isotropically deposits bottom electrode Material. Step 506d patterns the bottom electrode material. Step 506e etches to form patterned bottom electrodes.

Some aspects of the method include further steps. Step 503, prior to forming the silicon oxide layer, leans the Si substrate with SC1 and SC2. In others, Step 505b, prior to selectively depositing the PGO film, isotropically deposits TEOS. Step 505c CMP planarizes the TEOS to the level of the bottom electrode. Step 505d uses an HF dip to clean the exposed bottom electrode surfaces.

A method for forming a memory device from selectively deposited PGO and a selectively deposited PGO film device have been described. Examples have been given to illustrate the fabrication process and device characteristic. However, the invention is not limited to merely these examples. Other variations and embodiments of the invention will occur to those skilled in the art.

We claim:

1. A method for selectively forming a $Pb_5Ge_3O_{11}$ (PGO) thin film memory device, the method comprising:

forming a silicon (Si) substrate;

forming a silicon oxide film overlying the substrate;

forming a patterned bottom electrode overlying the silicon oxide film; and, selectively depositing a PGO film overlying the bottom electrode as follows:

depositing a seed layer of PGO; and, forming a c-axis oriented PGO layer overlying the seed layer.

2. The method of claim 1 further comprising:

following the deposition of the PGO film, annealing.

3. The method of claim 2 further comprising:

preparing a PGO precursor as follows:

dissolving a mixture of [Pb(thd)$_2$] and {Ge(ETO)$_4$} in a solvent;

injecting the solution into a vaporizer:

at a temperature in the range of 180 to 240 degrees C.; and, at a pump rate in the range of 0.05 to 0.2 millimeters/minute (ml/min); and, maintaining the vaporizer feed line at a temperature in the range of 185 to 245 degrees C.

4. The method of claim 3 wherein dissolving a mixture of [Pb(thd)$_2$] and {Ge(ETO)$_4$} in a solvent includes mixing the [Pb(thd)$_2$] and {Ge(ETO)$_4$} in a molar ratio in the range of 5:3 to 5.5:3.

5. The method of claim 4 wherein dissolving a mixture of [Pb(thd)$_2$] and {Ge(ETO)$_4$} in a solvent includes using a solvent of isopropanol, tetraglyme, and an element selected from the group including butyl ether and tetrahydrofuran.

6. The method of claim 5 wherein using a mixed solvent includes using the mixed solvent in a molar ratio of 2:1:8.

7. The method of claim 6 wherein depositing a seed layer of PGO includes:
heating the substrate to a temperature in the range of 500 to 540 degrees C.;
creating a pressure in the range of 1 to 5 Torr;
creating an oxygen partial pressure of 20 to 30%;
creating a vaporizer temperature in the range of 180 to 200 degrees C.;
delivering the vaporized precursor Solution at a rate of 0.05 to 0.1 ml/min, for a duration in the range of 5 to 20 minutes.

8. The method of claim 7 wherein depositing a c-axis PGO layer includes:
heating the substrate to a temperature in the range of 380 to 420 degrees C.;
creating a pressure in the range of 5 to 10 Torr;
creating an oxygen partial pressure of 30 to 40%;
creating a vaporizer temperature in the range of 200 to 240 degrees C.;
delivering the vaporized precursor solution at a rate of 0.1 to 0.2 ml/min, for a duration in the range of 1 to 3 hours.

9. The method of claim 8 wherein annealing includes annealing at a temperature in the range of 520 to 560 degrees C., for a duration in the range of 0.5 to 1 hour.

10. The method of claim 9 wherein annealing includes annealing in an oxygen atmosphere.

11. The method of claim 2 wherein forming a patterned bottom electrode overlying the silicon oxide film includes:
forming a bottom electrode first layer of a first metal overlying the silicon oxide; and,
forming a bottom electrode second layer of a second metal overlying the first layer.

12. The method of claim 11 wherein forming a bottom electrode first layer of a first metal overlying the silicon oxide includes the first metal being a metal selected from the group including Ti, TiN, Ta, and TaN; and,
wherein forming a bottom electrode second layer of a second metal overlying the first layer includes the second metal being a metal selected from the group including Ir, Pt, Au, and Rh.

13. The method of claim 12 wherein forming a bottom electrode first layer overlying the silicon oxide includes forming a layer of Ti having a thickness in the range of 10 and 30 nanometers (nm); and,
wherein forming a bottom electrode second layer of a second metal overlying the first layer includes the second metal having a thickness in the range of 100 to 200 nm.

14. The method of claim 2 wherein forming a bottom electrode overlying the silicon oxide film includes:
isotropically depositing bottom electrode material;
patterning the bottom electrode material; and,
etching to form patterned bottom electrodes.

15. The method of claim 14 further comprising:
prior to forming the silicon oxide layer, cleaning the Si substrate with SC1 and SC2.

16. The method of claim 1 wherein forming a silicon oxide layer includes forming a silicon oxide layer having a thickness in the range of 3.5 to 15 nm.

17. The method of claim 1 further comprising:
prior to selectively depositing the PGO film, isotropically depositing TEOS;
chemical mechanically polish (CMP) planarizing the TEOS to the level of the bottom electrode; and,
using an HF dip to clean the exposed bottom electrode surfaces.

18. The method of claim 2 further comprising:
forming a top electrode overlying the PGO film.

19. The method of claim 1 further comprising:
forming a polysilicon layer interposed between the oxide layer and the bottom electrode.

20. A method for selectively forming a $Pb_5Ge_3O_{11}$ (PGO) thin film memory device, the method comprising:
forming a silicon (Si) substrate;
forming a silicon oxide layer having a thickness in the range of 3.5 to 15 nm;
forming a patterned bottom electrode overlying the silicon oxide film; and,
selectively depositing a PGO film overlying the bottom electrode.

21. A method for selectively forming a $Pb_5Ge_3O_{11}$ (PGO) thin film memory device, the method comprising:
forming a silicon (Si) substrate;
forming a silicon oxide film overlying the substrate;
forming a patterned bottom electrode overlying the silicon oxide film;
isotropically depositing TEOS;
chemical mechanically polish (CMP) planarizing the TEOS to the level of the bottom electrode;
using an HF dip to clean the exposed bottom electrode surfaces; and,
selectively depositing a PGO film overlying the bottom electrode.

22. A method for selectively forming a $Pb_5Ge_3O_{11}$ (PGO) thin film memory device, the method comprising:
forming a silicon (Si) substrate;
forming a silicon oxide film overlying the substrate;
forming a polysilicon layer overlying the oxide film;
forming a patterned bottom electrode overlying the polysilicon layer; and,
selectively depositing a PGO film overlying the bottom electrode.

* * * * *